United States Patent [19]

Ziegler

[11] Patent Number: 4,924,132
[45] Date of Patent: May 8, 1990

[54] TEMPERATURE SENSITIVE QUARTZ OSCILLATOR CRYSTAL WITH TEMPERATURE COEFFICIENT CONTROLLED IN MANUFACTURE

[75] Inventor: Horst Ziegler, Paderborn, Fed. Rep. of Germany

[73] Assignee: W. C. Heraeus GmbH, Hanau, Fed. Rep. of Germany

[21] Appl. No.: 312,332

[22] Filed: Feb. 16, 1989

Related U.S. Application Data

[63] Continuation of Ser. No. 102,121, Sep. 29, 1987, abandoned.

[30] Foreign Application Priority Data

Feb. 4, 1987 [DE] Fed. Rep. of Germany ....... 3703241

[51] Int. Cl.$^5$ ............................................. H01L 41/08
[52] U.S. Cl. ..................... 310/361; 310/369; 73/855; 374/117
[58] Field of Search ............... 310/360, 361, 367, 369; 374/117, 118, 188; 73/855, DIG. 1

[56] References Cited

U.S. PATENT DOCUMENTS

| | | | |
|---|---|---|---|
| 2,176,653 | 10/1939 | Bokovoy | 310/361 |
| 2,227,904 | 1/1941 | Hight | 310/361 X |
| 2,284,753 | 6/1942 | Mason | 310/361 |
| 2,486,916 | 11/1949 | Bottom | 310/369 |
| 2,676,275 | 4/1954 | Bigler | 310/361 X |
| 4,114,062 | 9/1978 | Mattuschka | 310/369 X |
| 4,454,443 | 6/1984 | Lukaszek et al. | 310/369 X |
| 4,472,656 | 9/1984 | Franx | 310/361 |

FOREIGN PATENT DOCUMENTS 2327176 12/1973 Fed. Rep. of Germany .
2454321 5/1975 Fed. Rep. of Germany .
2604452 8/1976 Fed. Rep. of Germany .
60-131435 7/1960 Japan .

OTHER PUBLICATIONS

Handbook of Piezoelectric Crystals for Radio Equipment Designers, by J. Buchanan, WADC Technical Report 54-248, Dec. 1954, pp. 12, 20 and 21.
Proceedings of the IRE, Aug. 1962, pp. 1812-1923.
DIN 45 102, Oct. 1964, pp. 1-10.
A.E.U. vol. 18, 1964, Issue 10, pp. 624-629.
A.E.U. vol. 18, 1964, Issue 10, pp. 616-625.

*Primary Examiner*—Mark O. Budd
*Attorney, Agent, or Firm*—Frishauf, Holtz, Goodman & Woodward

[57] ABSTRACT

The principal surfaces of an oscillator quartz crystal body for a temperature sensor oscillator are plane, parallel and of substantially the same size and are oriented with respect to the usual x-y-z coordinate system of electric, mechanical and optic axes so that the angle $\phi$ of the electric (x) axis with respect to either of these planes lies within a tolerance range extending from $+1°$ to $-1°$, while the angle $\theta$ of the optic (z) axis with respect to either of these plane lies either in the 3°-6° range or in the 68°-72° range. Since in the regions of $\theta = 4°$ and $\theta = 70°$ the change of the temperature coefficient with variation of the angle $\theta$ is relatively slight, because of the respective presence of a maximum and a minimum of the temperature coefficient in these ranges, quartz oscillator crystals of the orientation above-defined can be mass-produced within industrially convenient mechanical tolerance ranges with practically identical temperature coefficients.

14 Claims, 3 Drawing Sheets

TEMPERATURE SENSITIVE QUARTZ OSCILLATOR CRYSTAL WITH TEMPERATURE COEFFICIENT CONTROLLED IN MANUFACTURE

This application is a continuation of application Ser. No. 102,121, filed Sept. 29, 1987, now abandoned.

The invention concerns a temperature sensitive quartz oscillator crystal for temperature measurement which can be produced in quantity with a narrow tolerance range for the temperature coefficient of quartz crystal oscillator frequency.

There is known from U.S. Pat. No. 3,486,023 a temperature sensitive quartz oscillator crystal, the so-called y-cut, which is known for having a high temperature coefficient of oscillation frequency. "Y-cut" here means that the parallel planes in which the crystal is cut, to define the major surfaces of the oscillator crystal, run in the so-called y-plane, in which the x and z axes lie. Quartz crystals have an x-y-z coordinate system defined by the electrical axis, known as the x axis, the mechanical axis, known as the y axis, and the optical axis, known as the z axis. When a quartz oscillator crystal plate is cut in the y plane as just mentioned, the angle included between the electrical x axis and each such cut surface is 0°. In other words, the electric x axis can be said to intersect the plane of the cut surface at 0°, as a way of saying that the electric x axis is parallel to or lies in that plane. The same holds true for the angle included between the optic z axis and the surface of cutting. Intersection at an angle of 0° is a useful concept when it is understood that the angle of cut, in the manufacturing of crystal planes, must lie within a tolerance range centered on the nominal or desired angle of cut as a matter of practice, and when the desired angle of cut is parallel to the x axis, then in the middle of the tolerance range for the angle of intersection of the x axis with the plane of cut the value of the intersection angle will be 0°.

In the case of strictly y-cut crystals, both the angle $\phi$ of intersection of the planes of cut by the x axis and the angle $\theta$ of intersection by the z axis are zero.

Since in the region of around $\phi = 0$ the rate of change of the temperature coefficient of oscillator frequency with respect to the variation of angle of cut is relatively large, it is necessary to provide an angle of cut which is as precise as possible, which means that accuracy within a very narrow angular tolerance is needed in order to obtain an adequately defined relation of the oscillator frequency with temperature for commercially produced oscillator crystals. Otherwise, it would be necessary to measure the depencence of frequency on temperature for every individual quartz oscillator crystal before its use and to make a different measurement scale for each oscillator crystal.

SUMMARY OF THE INVENTION

It is an object of the present invention to provide quartz oscillator crystals, particularly the so-called thick oscillator crystals, having a temperature coefficient which is as great possible and which will nevertheless show a scatter of the temperature coefficient among nominally identical mass-produced crystals which is as small as possible.

Briefly, at the same time that the tolerance range of the angle $\phi$ at which the electrical axis (x) intersects the angle of cut lies between $+1°$ and $-1°$, as is usual with conventional y-cut crystals, the range of the angle $\theta$ at which the optic (z) axis intersects the planes of cut lies within one of two narrow ranges, the first of which extends from 3° to 6° and the second of which extends from 68° to 72°.

In a preferred embodiment, the parallel crystal surfaces corresponding to the planes of cut just mentioned, which are oriented as just mentioned, are of circular contour centered on a common axis perpendicular to these parallel surfaces and, at the periphery of the circular crystal faces as defined, there is an outwardly directed bulge which extends around the entire periphery.

In another embodiment, the parallel major surfaces have the elongated contour of a circle from which oppositely located peripheral segments have been lopped off by parallel secants equidistant from the circle centers, a contour shape for which it is not important to provide a peripheral bulge in order to obtain a desirably high Q.

The invention has the advantage that temperature sensitive quartz oscillator crystals can be produced in mass-production within comfortable mechanical tolerance ranges with a practically constant temperature coefficient of the product. With such oscillator crystals mass-produced temperature sensors can be effectively coupled to previously specified evaluation equipment after single point calibration or zero point calibration. This brings the further advantage that simple interchangeability of temperature sensors is achieved.

BRIEF DESCRIPTION OF THE DRAWINGS

The invention is further described by way of illustrative examples with reference to the annexed drawings, in which:

FIG. 2b is the schematic cross-section of the crystal body of FIG. 1 showing, out of thickness proportion, electrodes not shown in FIG. 2a;

DESCRIPTION OF THE ILLUSTRATED EMBODIMENTS

Figure 1:
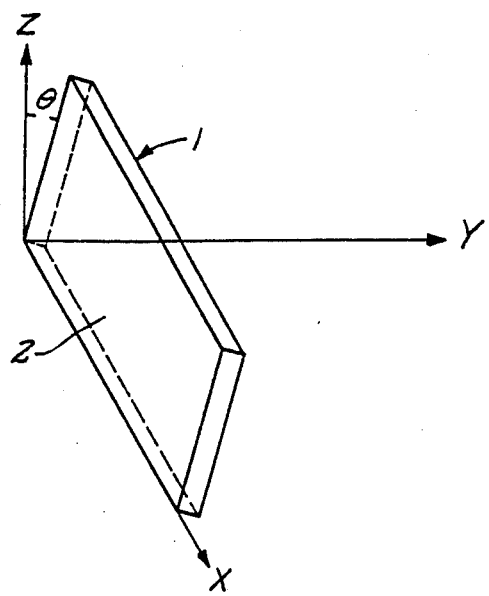
FIG. 1 is a perspective diagram of planes of cut of the major surfaces of a crystal plate or wafer according to the invention and the relation of these surfaces of the coordinate system provided by the crystal axes.

FIG. 1 shows a coordinate system with x, y and z axes respectively corresponding to the electrical, mechanical and optical axes of the crystal structure of quartz, with a plate of quartz shown oriented in that system in accordance with the invention. The crystal plate shown has an edge coinciding with the x axis and terminating at one corner of the plate which coincides with the origin of the coordinate system. The diagram shows the orientation of the surface 2 of the quartz plate 1. The angle $\phi$ between the x axis and the surface 2 is 0° because that axis lies in the plane of the surface 2, as above discussed. That angle is not marked because that is difficult to do in such a drawing. This zero angle situation is representative of the requirement of the invention that this angle should lie in a tolerance zone between +1° and −1°. In other words it can vary just a little on either side of zero.

The angle $\theta$ enclosed between the z axis and the plane of the surface 2 is marked in the figure and, as already mentioned, in accordance with the invention, this angle is either in the range from 3° to 6° or in the range from 68° to 72°. FIG. 1 actually illustrates the first of these alternatives, while the second of them is illustrated in FIG. 4, which is a diagram in which the three axes of the crystal are shown in the same way as in FIG. 1.

Preferably, the angle $\phi$, which may be referred to as the first angle of cut lies in the range between +15' and −15' and the angle $\theta$, which may be referred to as the second angle of cut, lies in the range of 4°8'±3' or in the range of 70°±3'. In the range just specified which is near 4°, the temperature coefficient has a maximum so that if the angle is slightly above or below 4° there is only a very small change of the temperature coefficient. Within the narrower preferred range near 4° only the very smallest variation in the temperature coefficient can be observed. In the region where $\phi$ is approximately 70°, moreover, the temperature coefficient has a well defined minimum so that in this region also there is a tolerance zone with only the very smallest change of the temperature coefficient. Between these two ranges of angle the function of the temperature coefficient passes through zero. This happens when $\phi$ is approximately 30°. At this point temperature changes have no effect on the oscillatory behavior of the quartz crystal, which means that quartz crystal so cut would be totally insensitive and useless as a temperature sensor.

Figure 2A:
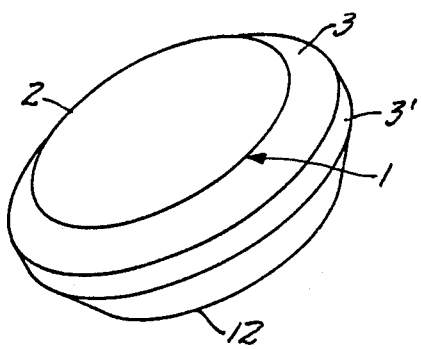
FIG. 2a is a perspective schematic view of a crystal wafer according to the invention which is of circular contour.
Figure 2B:
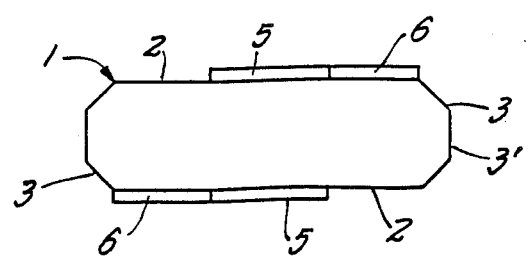
Figure 3A:
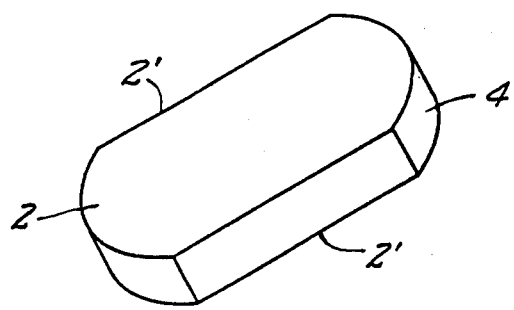
FIG. 3a is a perspective view of a crystal plate according to the invention with a contour herein designated of that of a segmented circle.
Figure 3B:
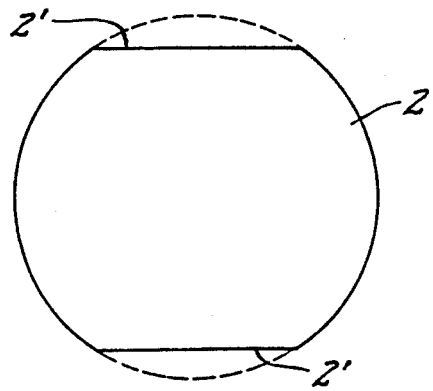
FIG. 3b is a plan view diagram illustrating the geometric construction of the contour of the crystal body of FIG. 3a, and FIG. 4 is a diagram similar to FIG. 1 for showing the difference, in the orientation of the planes of cut, between embodiments the invention of FIG. 1 utilizing the neighborhood of a maximum of the temperature coefficient and those of FIG. 4 utilizing the neighborhood of a minimum of the temperature coefficient with respect to variation of the angle $\phi$ of intersection of the z axis with the planes of cut

Whereas FIG. 1 shows only the orientation of the parallel planes that provide the major surfaces of the crystal as cut for a temperature sensitive oscillator in accordance with the invention, FIGS. 2a and 2b illustrate the complete shape of one embodiment and FIGS. 3a and 3b illustrate the complete shape of another embodiment of quartz oscillator crystal body in accordance with the invention, which each have a satisfactorily high value of Q.

Figure 4:
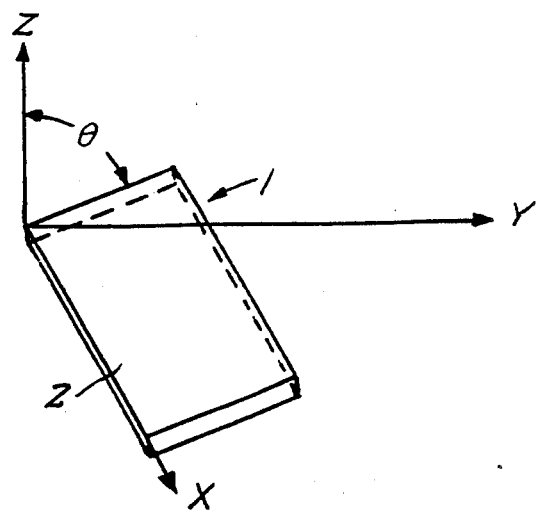

FIG. 2a is a perspective view that shows a circular plane surface 2 which is one of the two surfaces of the crystal body shown which is oriented like the plate shown in FIG. 1, or as shown in FIG. 4. The crystal body has another such plane surface on the opposite side of the body but only a portion of the edge 12 of that plane is visible in FIG. 2a. These two planes are both centered on a common axis perpendicular to them. As shown in FIG. 2a, between the two surfaces just mentioned, around their edges, is a beveled peripheral surface 3 extending around the entire circumference of the surface 2, which is provided for obtaining a high Q for the oscillator crystal body. The bevelling provides an encircling bulge of trapezoidal cross-section so that, as shown in FIG. 2b, a median cross-section of the body is in the shape of a laterally elongated octagon. The quartz body illustrated in FIGS. 2a and 2b has a diameter of about 4.5 mm and a thickness of about 0.1 mm; its frequency is in the range of 16.75 mHz–50 kHz at a temperature of 25° C., and a Q value of at least 5,000 is obtained for such a crystal.

Figure 5:
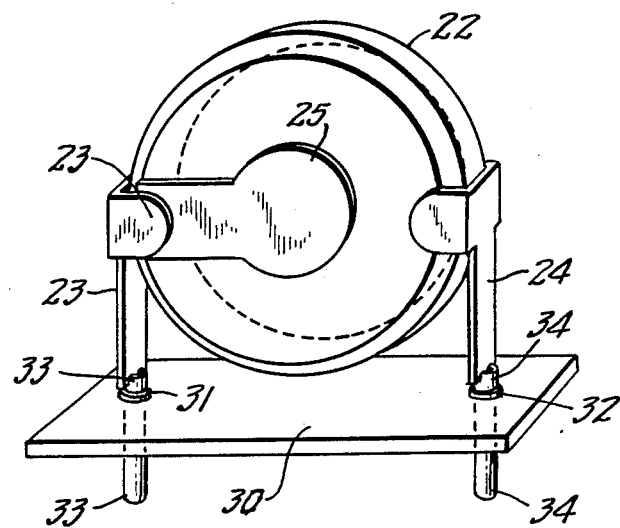
FIG. 5 is a perspective view of the crystal shown in FIGS. 2a and 2b, with the same disproportional showing of the electrodes shown in FIG. 2b, mounted for vibration in the thickness shear-mode.

For use of the crystal body in a temperature sensor oscillator, silver electrodes 5 are deposited by vapor deposition on the surfaces 2. The electrodes 5 overlap each other circularly in the inner portions of the disk and have lateral extensions 6 in several lateral directions in order to provide laterally offset contacting by leaf springs located in the temperature sensor casing. The structure of quartz oscillators and of crystal holders therefor is well known, but a few characteristics desirable for temperature sensors are worth mentioning. A crystal holder is schematically illustrated in a perspective view in FIG. 5. The quartz body 22 is held in the contact with the electrical contact springs 23 and 24 where they touch the electrodes (one of which appears at 25) by a conductive adhesive (not shown) which is resistant to high temperature. These elements are enclosed in a hermetically stainless steel holder casing (not shown except for the bottom 30) within which is a protective gas atmosphere of argon. The exterior of the stainless steel casing is smooth and thereby well suited for industrial temperature measurement. The crystal holder casing bottom 30 has two special heat resistant glass feed throughs 31 and 32 for connection pins. For this purpose, connecting tubes 33 and 34 serving as connections and supports are laser welded to the casing bottom. They are sealed after the argon atmosphere is in place. The contact springs 23 and 24 inside the casing which holds the quartz body in position are connected to the connections pins by spot welding.

It should be mentioned with respect to FIG. 2b that in that figure the electrodes 5 were shown disproportionally magnified in order to make their position more readily visible. The same applies to the contact springs.

The operating range of the temperature sensor device just described for use with the quartz body of FIGS. 2a and 2b extends over temperatures between −40° C. and +300° C.

FIGS. 3a is a perspective view of a differently shaped embodiment of a quartz crystal body for a temperature sensor oscillator according to the invention. In this case, the surfaces 2, which are again oriented either in accordance with FIG. 1 or in accordance with FIG. 4, have the shape of segmented circles as illustrated in FIG. 3b, which is a plan view showing oppositely located outer segments of a hypothetically complete disk cut off by two parallel and oppositely located secants 2' on both of the parallel surfaces to define a central segment surface having ends bounded by arcs of the same circle. As the result of this segmentation the quartz body shown in these figures has a high Q value similar to that described for the quartz body of FIGS. 2a and 2b, so that bevelling the peripheral surface 4 in this case is not necessary and can be dispensed with. The application of the electrodes and the holding and contacting respectively of the crystal body and its electrodes in a temperature sensor casing for this crystal body correspond to those described in connection with the quartz body illustrated in FIGS. 2a and 2b.

Although the invention has been described and illustrated with respect to two particular embodiments, it will be understood that further variations and modifications are possible within the inventive concept. For example, other ways of shaping, contacting and encasing the quartz body besides those specifically mentioned are also useful.

I claim:

1. Temperature-sensitive quartz crystal oscillator for precise measurement of temperature comprising a quartz crystal having a pair of parallel surfaces of substantially equal size each carrying one of a single pair of electrodes situated thereon substantially opposite each other, each electrode having a principal portion covering a central area of one of said parallel surface and a lateral portion extending from said principal portion towards an edge of said one of said parallel surfaces so as to have a border portion near said edge, and each of which parallel surfaces are intersected by the electrical (x) axis of the crystal at an angle $\phi$ within the tolerance range between $+1°$ and $-1°$, and wherein, for reducing the range of variation of the temperature coefficient of oscillation frequency within said tolerance range, the angle $\theta$ at which said optic (z) axis intersects said pair of planes lies within the range from 3° to 6°, whereby the manufacturing tolerances are reduced for a high precision quartz temperature sensor, said crystal being held in a contacting holder by means holding said crystal by attachment to said respective electrodes at border portions of said lateral electrode portions and being connected in an oscillation producing circuit, whereby the crystal is caused to vibrate in a thickness-shear mode.

2. Temperature-sensitive quartz crystal oscillator for precise measurement of temperature comprising a quartz crystal having a pair of parallel surfaces of substantially equal size each carrying one of a single pair of electrodes situated thereon substantially opposite each other, each electrode having a principal portion covering a central area of one of said parallel surface and a lateral portion extending from said principal portion towards an edge of said one of said parallel surfaces so as to have a border portion near said edge, and each of which parallel surfaces are intersected by the electrical (x) axis of the crystal at an angle $\phi$ within the tolerance range between $+1°$ and $-1°$, and wherein, for reducing the range of variation of the temperature coefficient of oscillation frequency within said tolerance range, the angle $\theta$ at which said optic (z) axis intersects said pair of planes lies within the range from 68° to 72°, whereby the manufacturing tolerances are reduced for a high precision quartz temperature sensor, said crystal being held in a contacting holder by means holding said crystal by attachment to said respective electrodes at border portions of said lateral electrode portions and being connected in an oscillation producing circuit, whereby the crystal is caused to vibrate in a thickness-shear mode.

3. Oscillator as defined in claim 1, wherein said tolerance range within which said angle of intersection of said electrical (x) axis of said crystal lies is between $+15'$ and $-15'$ and wherein the range in which said angle of intersection of said optic (z) axis of said crystal lies is from 4°5' to 4°11'.

4. Temperature-sensitive oscillator as defined in claim 2, wherein said tolerance range within which said angle of intersection of said electrical (x) axis of said crystal lies is between $+15'$ and $-15'$ and wherein the range in which said angle of intersection of said optic (z) axis of said crystal lies is from 69°57' to 70°3'.

5. Temperature-sensitive oscillator as defined in claim 1, wherein said parallel surfaces (2) of said crystal are of circular contour and are centered on a common axis perpendicular to said surfaces.

6. Temperature-sensitive oscillator as defined in claim 2, wherein said parallel surfaces (2) of said crystal are of circular contour and are centered on a common axis perpendicular to said surfaces.

7. Temperature-sensitive oscillator as defined in claim 5, in which the mid-portion of said crystal, between said parallel surfaces, has a peripheral surface (3) in the shape of an outwardly extending bulge (3') which extends around the entire periphery of the crystal.

8. Temperature-sensitive oscillator as defined in claim 6, in which the mid-portion of said crystal, between said parallel surfaces, has a peripheral surface (3) in the shape of an outwardly extending bulge (3') which extends around the entire periphery of the crystal.

9. Temperature-sensitive oscillator as defined in claim 7, wherein the profile of said bulge of said peripheral surface of said crystal is trapezoidal.

10. Temperature-sensitive oscillator as defined in claim 8, wherein the profile of said bulge of said peripheral surface of said crystal is trapezoidal.

11. Temperature-sensitive oscillator as defined in claim 1, wherein said parallel surfaces of said crystal have the contour of segmented circles, defined by the presence of parallel secants equidistant from the circle center cutting off peripheral segments from the remainder of the circle, the secants of the respective parallel surfaces being congruent to each other in the sense that they lie in places perpendicular to said parallel segmented circle surfaces, each containing a secant defining an edge of each of said parallel segmented circle surfaces.

12. Temperature-sensitive oscillator as defined in claim 2, wherein said parallel surfaces of said crystal have the contour of segmented circles, defined by the presence of parallel secants equidistant from the circle center cutting off peripheral segments from the remainder of the circle, the secants of the respective parallel surfaces being congruent to each other in the sense that they lie in planes perpendicular to said parallel segmented circle surfaces, each containing a secant defining an edge of each of said parallel segmented circle surfaces.

13. Method of precise measurement of temperature utilizing a crystal-controlled oscillator controlled by a quartz crystal plate having electrodes respectively on opposite parallel major surfaces of said plate, each having a principal portion covering a central portion of one of said major surfaces and having a lateral contact extension including a border contact portion and extending laterally from said principal portion of the electrode, comprising the steps of:

providing for said oscillator a quartz crystal having a pair of parallel surfaces of substantially equal size which are intersected by the electrical (x) axis of the crystal at an angle $\phi$ within the tolerance range between $+1°$ and $-1°$, and wherein, for reducing the range of variation of the temperature coefficient of oscillation frequency within said tolerance range, the angle $\theta$ at which said optic (z) axis intersects said pair of places lies within the range from 3° to 6°, and holding said crystal, in a holding connected to a crystal-controlled oscillator circuit, by a pair of electrical contact and mechanical attachment means respectively attached to said border contact portions of said electrodes and thereby vibrating said crystal in the thickness-shear mode.

14. Method of precise measurement of temperature utilizing a crystal-controlled oscillator controlled by a quartz crystal plate having electrodes respectively on opposite parallel major surfaces of said plate, each having a principal portion covering a central portion of one of said major surfaces and having a lateral contact extension including a border contact portion and extending laterally from said principal portion of the electrode, comprising the steps of:

providing for said oscillator a quartz crystal having a pair of parallel surfaces of substantially equal size which are intersected by the electrical (x) axis of the crystal at an angle $\phi$ within the tolerance range between $+1°$ and $-1°$, and wherein, for reducing the range of variation of the temperature coefficient of oscillation frequency within said tolerance range, the angle $\theta$ at which said optic (z) axis intersects said pair of places lies within the range from 68° to 72°, and holding said crystal, in a holding connected to a crystal-controlled oscillator circuit, by a pair of electrical contact and mechanical attachment means respectively attached to said border contact portions of said electrodes and thereby vibrating said crystal in the thickness-shear mode.

* * * * *